(12) United States Patent
Wik

(10) Patent No.: US 7,557,618 B1
(45) Date of Patent: Jul. 7, 2009

(54) CONDITIONING LOGIC TECHNOLOGY

(76) Inventor: Thomas R. Wik, 1790 Verdite St., Livermore, CA (US) 94550

(\*) Notice: Subject to any disclaimer, the term of this patent is extended or adjusted under 35 U.S.C. 154(b) by 14 days.

(21) Appl. No.: 11/903,836

(22) Filed: Sep. 24, 2007

Related U.S. Application Data

(60) Provisional application No. 60/847,027, filed on Sep. 25, 2006.

(51) Int. Cl.
*H03K 19/20* (2006.01)
*H03K 19/094* (2006.01)

(52) U.S. Cl. .................................... 326/121; 327/108

(58) Field of Classification Search ............... 326/9–11, 326/83, 86, 87, 93–98, 112, 119, 121; 327/108, 327/109, 208–212, 214, 215, 224, 225
See application file for complete search history.

(56) References Cited

U.S. PATENT DOCUMENTS

| | | | | |
|---|---|---|---|---|
| 4,710,650 A | * | 12/1987 | Shoji | 326/98 |
| 5,483,177 A | * | 1/1996 | Van Lieverloo | 326/27 |
| 5,640,105 A | * | 6/1997 | Sobelman et al. | 326/36 |
| 5,656,948 A | * | 8/1997 | Sobelman et al. | 326/35 |
| 6,031,390 A | * | 2/2000 | Fant et al. | 326/36 |
| 6,313,660 B1 | * | 11/2001 | Sobelman et al. | 326/39 |
| 6,437,625 B1 | * | 8/2002 | Kojima et al. | 327/218 |
| 6,900,658 B1 | * | 5/2005 | Sobelman et al. | 326/35 |

\* cited by examiner

*Primary Examiner*—Vibol Tan
*Assistant Examiner*—Dylan White

(57) ABSTRACT

Conditioning logic modifies the electrical characteristics of conventional logic circuits to improve speed, power, and timing margins. This is accomplished by adding circuitry to pre-condition the state of the circuit to optimize any desired transition. Basic functionality of the logic circuit in response to the inputs is unchanged, but output delays, power dissipation, and timing margins can be improved and other characteristics of the circuit can also be controlled by the conditioning circuitry such as voltage levels, leakage current and power dissipation. The effect of the conditioning circuitry on the electrical and timing parameters of the logic function is controlled by binary feedback inputs to the conditioning circuitry. Feedback inputs can be generated from any combination of logic states and clock inputs including clock inputs and logic inputs not used in the logic function receiving the feedback input.

10 Claims, 8 Drawing Sheets

CONDITIONING LOGIC TECHNOLOGY

CROSS-REFERENCE TO RELATED APPLICATIONS

This application claims the benefit of provisional patent application Ser. No. 60/847,027 filed 2006 Sep. 25 by the present inventor.

FEDERALLY SPONSORED RESEARCH

Not Applicable

SEQUENCE LISTING OF PROGRAM

Not Applicable

BACKGROUND OF THE INVENTION

1. Field of Invention

This invention relates to digital circuits, specifically to improved performance, reduced power dissipation and improved circuit robustness for digital logic circuits.

2. Prior Art

Improved performance, reduced power dissipation, and circuit robustness are key objectives of semiconductor circuit design. Often these objectives are contradictory and require tradeoffs of one objective relative to another. Complementary digital logic such as CMOS is very robust but performance and power are negatively affected by large parasitic capacitances and crow-bar currents that flow during logic transitions. Dynamic logic has high performance characteristics because it utilizes discharge of a precharged node to change the logic state of the output. This allows a fast transition on the output because parasitic capacitances are smaller and there is no need to turn off competing pull-up or pull-down transistors as the input transitions from LOW to HIGH or from HIGH to LOW, respectively. This fight between pull-up and pull-down during the input transitions tends to slow down output transitions for standard gates implemented with complementary logic switches or transistors. The fight between the pull-up and pull-down transistors during the input transition also increases power dissipation due to the crow-bar current that flows directly through the pull-up and pull-down transistors both of which are partially ON during the transition period. This is especially true if input transitions are slow.

Dynamic Logic has disadvantages that compromise robustness and limit applicability in the case of modern high-leakage technologies. High leakage limits the maximum time interval between precharge turn-off and logic state evaluation. In the limit of high leakage this interval can become vanishingly small. Also, dynamic logic suffers from the constraints of charge sharing. This can further reduce the margin for maintaining the precharge level under worst-case conditions.

OBJECTS AND ADVANTAGES

This invention approaches the performance advantages of Dynamic Logic while controlling the disadvantages. This invention will be referred to as conditioning logic. Logic circuitry is enhanced by the addition of circuit elements that condition the state of the circuit before each transition to achieve better performance and power dissipation. It also has more general applications for modifying the electrical characteristics of generic logic circuits. Conditioning logic can approach the performance of Dynamic Logic while making it possible to adjust transistor sizes to achieve adequate robustness against leakage and charge sharing. Furthermore, Conditioning Logic can achieve performance enhancements for both positive and negative transitions on the outputs. Dynamic Logic gates normally are limited to fast transitions in one direction—typically fast negative transitions through the higher-mobility N-channel (NMOS) transistors in the case of Complementary MOS (CMOS) digital logic.

SUMMARY

Conditioning Logic achieves these desirable capabilities of faster transitions and lower power dissipation by adding extra conditioning transistors to the conventional primary transistors of a conventional logic circuit. In this application for performance improvement, the conditioning transistors replicate the primary transistors of the generic logic function. The pull-up conditioning transistor(s) operate in parallel with the primary pull-up transistor(s) and respond to logic inputs and clock inputs in the same way as the primary pull-up transistors. Similarly the pull-down conditioning transistor(s) operate in parallel with the primary pull-down transistor(s) and respond to logic inputs and clock inputs in the same way as the primary pull-down transistors. Both the pull-up and pull-down conditioning transistors are controlled by their respective enabling transistors that respond to one or more feedback signals to enable or disable the conditioning transistors. When the parallel pull-up conditioning transistors are disabled and the parallel pull-down conditioning transistors are enabled by the feedback signals, the negative transition on the output is speeded up because the total effective transistor size pulling the load of the output LOW is increased while the total effective size of the pull-up transistors pulling the output HIGH is reduced. When the parallel pull-down conditioning transistors are disabled and the parallel pull-up conditioning transistors are enabled by the feedback signals, the positive transition on the output is speeded up because the total effective transistor size pulling the load of the output HIGH is increased while the total effective size of the pull-up transistors pulling the output LOW is reduced. Crow-bar current is reduce for both positive and negative transitions because the effective size of the pull-down transistors or the effective size of the pull-up transistors, respectively, is reduced for these transitions.

DRAWINGS

Figures

DETAILED DESCRIPTION

Figure 1:
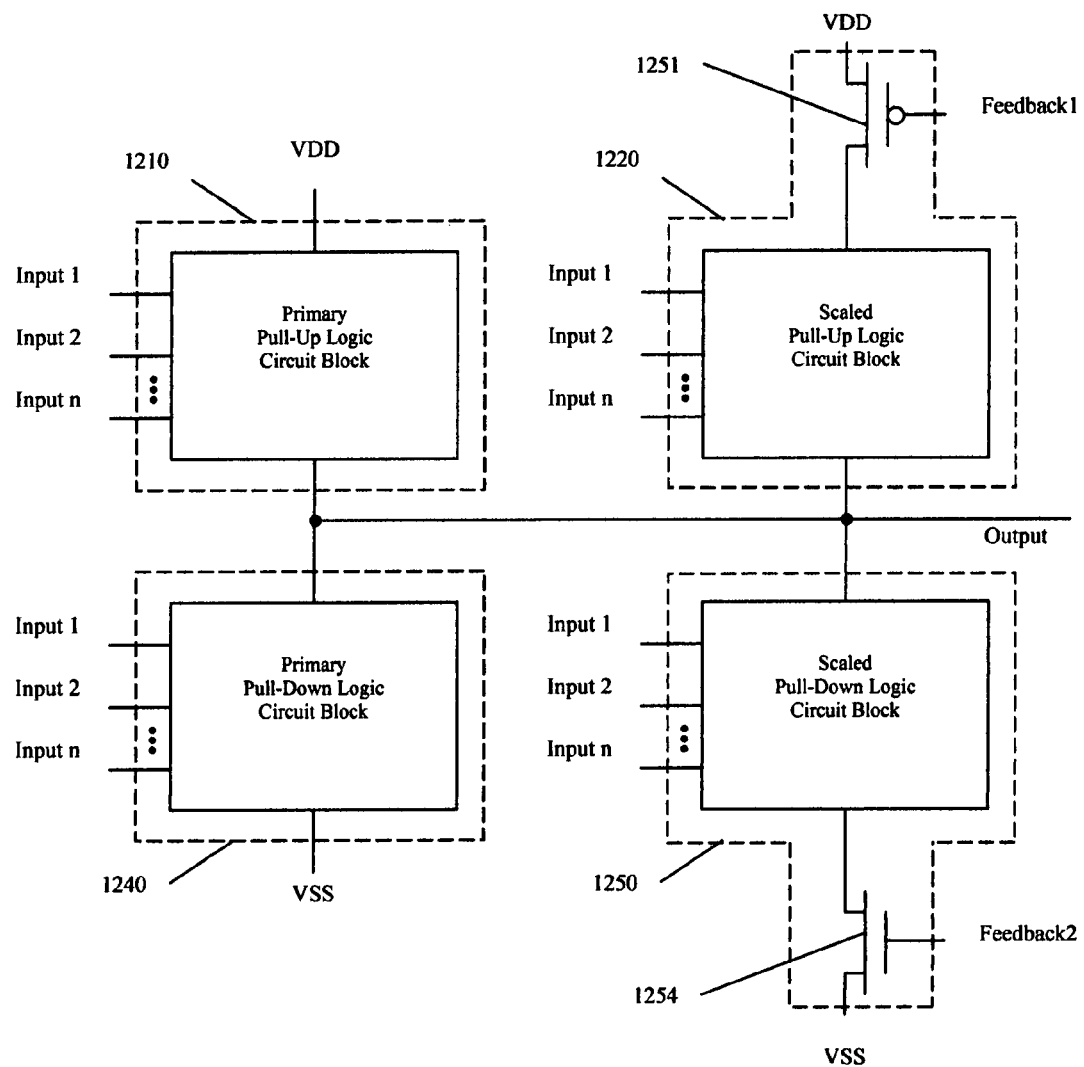
FIG. 1 shows a block diagram for a preferred embodiment of conditioning logic consisting of primary logic circuit blocks and scaled circuit blocks that are switched on and off using MOS transistors in this example under the control of feedback signals to control the timing of different conditioning states to improve electrical characteristics.

Preferred Generic Embodiment—FIGS. 1 and 2

FIG. 1 shows a block diagram of an example of conditioning logic. The normal pull-up circuitry of a conventional logic circuit is replicated in circuit block 1210, but the circuit block is scaled to have smaller drive than required. This circuitry can have any number of inputs 1, 2, . . . , n of any type including logic inputs and clock inputs. The normal pull-down circuitry of a conventional logic function is replicated in circuit block 1240, but the circuit block is scaled to have smaller drive than required. This circuitry also can have any number of inputs 1, 2, . . . , n of any type including logic inputs and clock inputs. In this conditioning logic implementation the conventional pull-up and pull-down circuitry has the same structure as the circuitry in prior art, but the sizes of individual switching elements are adjusted to be smaller. The combination of primary circuit elements which are smaller than required to drive the load and scaled circuit elements operating in parallel is sized to be adequate for driving the load at the desired slew rate and frequency.

Figure 2A:
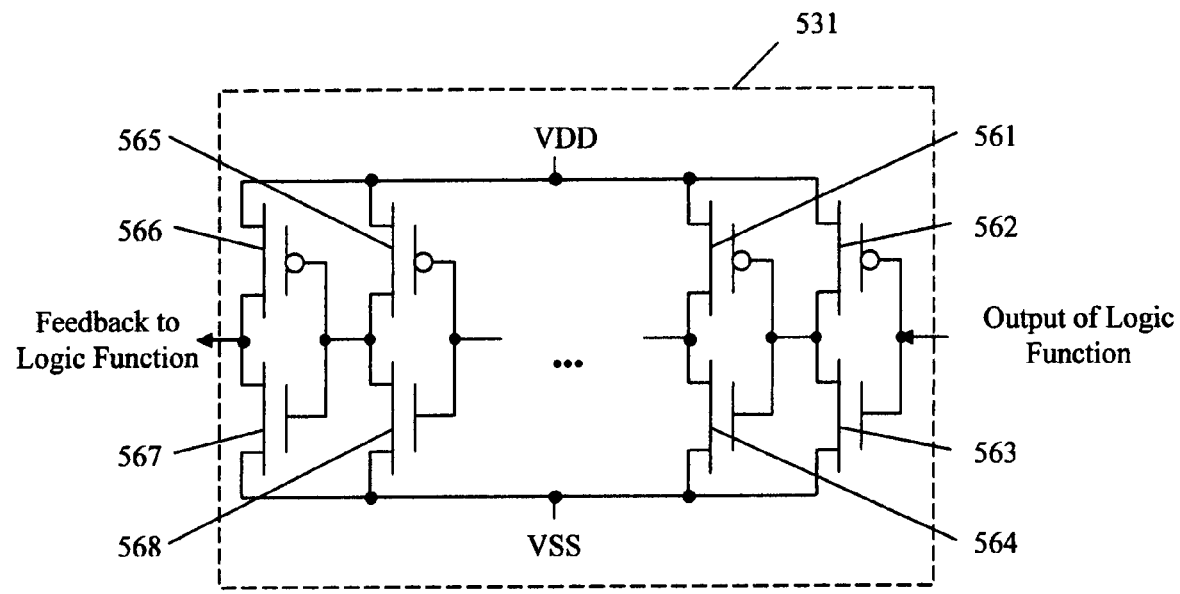
FIG. 2A shows a simple example of circuitry for generating the binary feedback signal that controls the scaled logic circuit blocks.
Figure 2B:
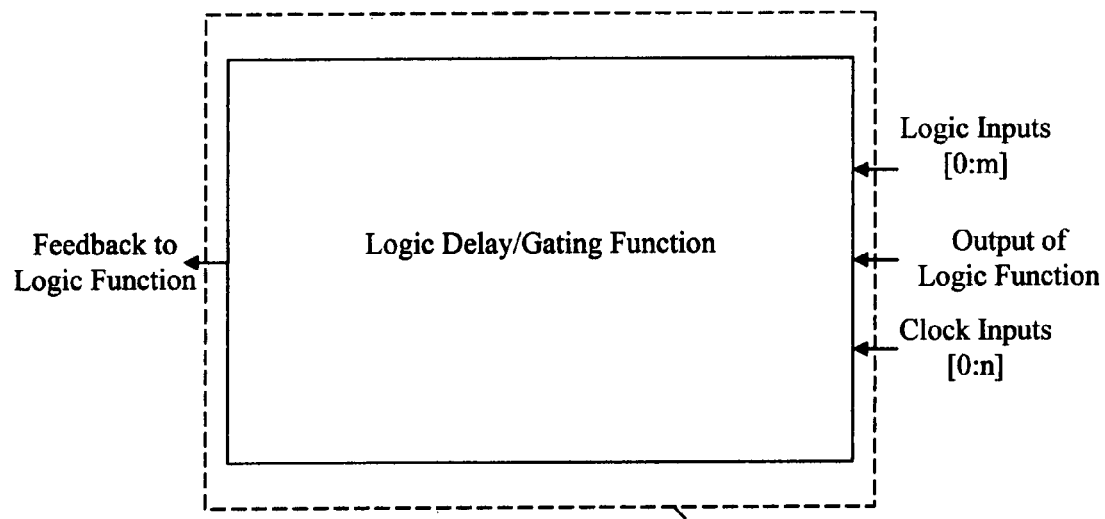
FIG. 2B shows a block diagram for a more generalized circuit for generating the binary feedback signals that could be controlled by additional logic signals and clocking signals in addition to the logic circuit output.

Circuit block 1220 represents the pull-up conditioning circuitry. This consists of a scaled version of the circuitry in circuit block 1210 in series with an enabling PMOS transistor 1251 controlled by the Feedback1 signal. Circuit block 1250 represents the pull-down conditioning circuitry. This consists of a scaled version of the circuitry in circuit block 1240 in series with an enabling NMOS transistor 1254 controlled by the Feedback2 signal. Typically the scaled circuitry of circuit blocks 1220 and 1250 is scaled to be larger than the primary pull-up and pull-down circuitry of circuit blocks 1210 and 1240 respectively. In this manner the primary pull-up and pull-down circuitry performs the function of keeper circuitry that is just strong enough to maintain the output against worst-case leakage and noise injection. The conditioning circuitry of circuit blocks 1220 and 1250 is sized to drive the full load of the logic function at the desired slew rates. The Feedback1 and Feedback2 signals are derived from any combination of output feedback logically combined with any combination of other inputs including logic inputs and clock inputs as shown in FIGS. 2A and 2B. Often Feedback1 and Feedback2 can be the same signal and for many useful applications this can be a simple delay of the output of the logic function as shown in FIG. 2A.

Any conventional logic circuit of prior art can be modified to a conditioning logic circuit version with improved electrical characteristics.

Operation—FIGS. 1, 2A, and 2B

FIG. 1 represents an example of conditioning logic applied to a logic circuit to improve timing performance and power dissipation. This is accomplished by dynamically modifying the effective sizes of pull-up and pull-down transitions during positive and negative transitions.

The enhanced performance of conditioning logic for high-to-low output transitions is achieved through reduction of the effective size of the pull-up transistors during the negative transition on the output. This reduces the effective size of the transistors fighting the pull-down of the output and causes the output to switch LOW earlier and faster. Similarly, when the parallel pull-down conditioning transistors are disabled and the parallel pull-up conditioning transistors are enabled by the feedback signals, the positive transition on the output is speeded up because the total effective transistor size pulling the load of the output HIGH is increased while the total effective size of the pull-down transistors pulling the output LOW is reduced. The enhanced performance of conditioning logic for LOW-to-HIGH output transitions is achieved through reduction of the effective size of the pull-down transistors during the positive transition on the output. This reduces the effective size of the transistors fighting the pull-up of the output and causes the output to switch HIGH earlier and faster. The size of the pull-up and pull-down transistors of a generic logic circuit can always be increased to the optimum size to drive the output load HIGH or LOW at the fastest practical rate, but conditioning logic makes it possible to decrease the effective size of the transistors that are fighting the positive or negative transition and thereby speed up the transition in comparison with a conventional prior-art logic circuit.

For this example of conditioning logic applied to speed up logic transitions, it is apparent that the primary transistors are actually smaller than the scaled transistors. This is due to the fact that the primary transistors are sized to be just large enough to maintain adequate margin against noise and leakage while the scaled transistors are sized to drive the output load at the desired slew rate. So typically the primary transistors will be small and the conditioning transistors will be large. Making the primary transistors larger relative to the scaled transistors slows down the transitions and increases the crowbar current, but this also makes the circuit more robust against leakage and noise effects. Consequently, the primary transistors are made as small as possible consistent with adequate margin for the circuit.

Thus, for this example, the conditioning logic circuit is optimized by making the primary transistors just large enough to provide adequate margin against leakage and charge-sharing effects. The required size of the primary transistors is dependent on the process technology and the worst-case statistical variation of critical process parameters such as sub-threshold leakage. In general the conditioning transistors will be larger than the primary logic transistors and the conditioning transistors will determine the slew rate on the output.

FIG. 2A shows an example of a feedback circuit that consists of a simple delay of the output of the logic circuit. In this case the delay is accomplished by connecting a series of inverters together. The output of the logic function is connected to the input of the first inverter stage consisting of pull-up transistor 562 and pull-down transistor 563. The output of this inverter stage is connected to the input of the second inverter stage consisting of pull-up transistor 561 and pull-down transistor 564. The delay can be set to any desired value by varying the number of inverter stages. A delay without inversion is accomplished by using an even number of inverter stages. In FIG. 2A the final pair of inverter stages is represented schematically by a first inverter consisting of pull-up transistor 565 and pull-down transistor 568 and a second inverter consisting of pull-up transistor 566 and pull-down transistor 567. The output of this last inverter stage is connected to the feedback input of the conditioning logic circuit. This delay is set to be long enough to insure that the positive or negative transitions of the output are completed before the enabling transistor of the pull-up or pull-down conditioning circuit is disabled respectively. Once the transition is complete the feedback signal switches state to condition the circuit to make a faster, more efficient transition to the opposite state.

FIG. 2B shows a representation of a more generic feedback path that can have any number of other logic inputs and/or clock inputs in addition to the output of the logic function. This makes it possible to achieve other optimizations of electrical characteristics such as de-skewing signals and controlling duty cycles.

ADVANTAGES OF THE PREFERRED GENERIC EMBODIMENT

The preferred embodiment of a conditioning logic circuit shown in FIG. 1 has the advantage of economy of enabling switches or transistors. Only one enabling switch or transistor is required for the scaled pull-up circuit block and only one enabling switch or transistor is required for the pull-down circuit block. Other implementations are possible with multiple enabling transistors. This preferred embodiment achieves the objectives of faster transitions and lower active and standby power with minimal added complexity compared to conventional circuits of prior art.

Figure 3:
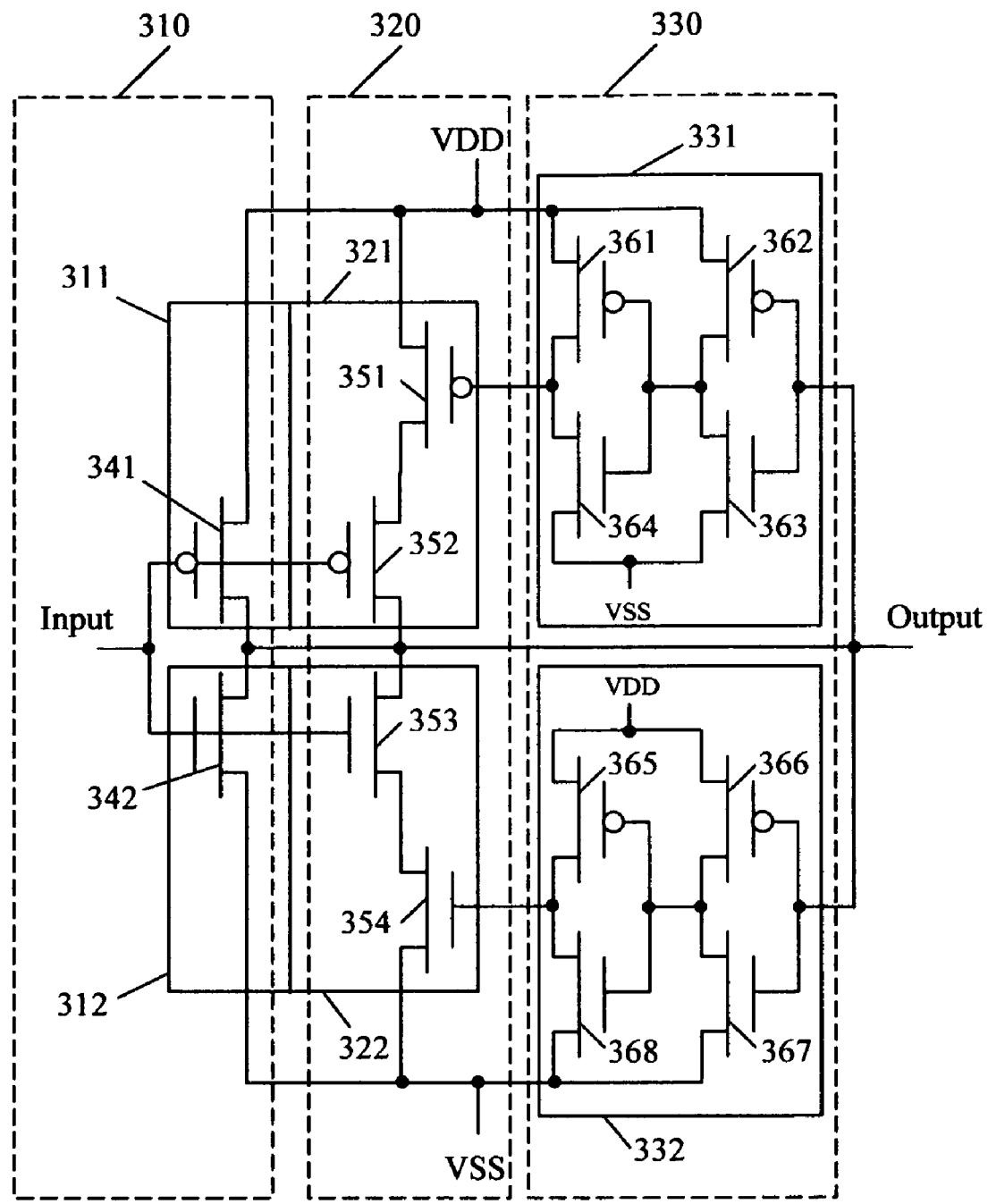
FIG. 3 shows an example of a conditioning logic inverter using the general form of FIG. 1 and a binary feedback circuit in the form of FIG. 2A.

Conditioning Logic Inverter—FIG. 3

FIG. 3 shows an example of a conditioning logic circuit in the form of FIG. 1 consisting of a simple inverter. Circuit block 310 contains the conventional logic transistors of an inverter consisting of a pull-up transistor 341 and a pull-down transistor 342 located in the pull-up circuit block 311 and pull-down circuit block 312 respectively. Circuit block 320 contains the conditioning circuits that modify the pull-up and pull-down behavior of the generic inverter function. Circuit block 321 contains the transistors that condition the pull-up of the inverter, 351 and 352. Circuit block 322 contains the transistors that condition the pull-down of the inverter, 353 and 354. Pull-up transistor 352 is connected in parallel with the pull-up transistor of the generic inverter 341 and its gate is driven by the same input. However, transistor 352 is in series with transistor 351, which enables or disables transistor 352 depending on the state of the pull-up feedback signal from circuit block 331. If the gate of transistor 351 is LOW, transistor 352 is enabled and the pull-up of the output occurs earlier and the slew rate on the positive transition on the output is increased. On the other hand, if transistor 352 is enabled during a negative transition on the output, it delays the negative transition and reduces the slew rate during part of the negative transition on the output. If transistor 352 is enabled during the negative transition, it also increases the crow-bar current during the transition and contributes to increased power dissipation. Thus, the speed of the pull-up of the inverter can be improved and power dissipation reduced by enabling transistor 352 during pull-up transitions and disabling this transistor during negative transitions on the output. This is the function of the feedback circuitry in circuit block 331.

The input to circuit block 331 is the output of the inverter. The inverter output signal is connected to a first inverter consisting of pull-up transistor 362 and pull-down transistor, 363. The output of this first inverter is the input to a second inverter consisting of pull-up transistor 361 and pull-down transistor 364. The output of this second inverter provides the control for the gate of the enabling transistor 351. The transistors of the two series inverters are sized to provide a delay from the output of the inverter to the gate of transistor 351 that is just long enough to enable the inverter to complete its transition from LOW to HIGH before the input to transistor 351 disables the pull-up transistor 352.

Similarly, the pull-down conditioning circuit block 322 consists of pull-down transistors, 353 and 354. Transistor 353 is connected in parallel with the pull-down transistor 342. Transistor 354 enables or disables transistor 353 depending on the feedback from the pull-down feedback circuit in circuit block 332. Circuit block 332 is comprised of two series inverters consisting of first inverter transistors 366 and 367 and second inverter transistors, 365 and 368. The input of the first inverter comes from the output of the inverter. The output of the second inverter controls the gate of the enabling transistor 354 that enables or disables the parallel pull-down transistor 353. The delay of the series inverters in circuit block 332 is set so transistor 353 is enabled during the negative transition on the output of the inverter and is disabled after this transition is completed.

It is possible that both the pull-up conditioning circuit block 321 and the pull-down conditioning circuit block 322 could be controlled by the same feedback circuit block 331. All other transistors function in identically the same manner. This simplification can be used if there is no need to maintain different delays on the feedback to the pull-up conditioning circuitry in circuit block 321 and the pull-down conditioning circuitry in circuit block 322.

Operation of the Conditioning Logic Inverter—FIGS. 3 and 2A

The conditioning logic inverter of FIG. 3 uses the simple feedback delay inverters of FIG. 2A to achieve proper timing of the feedback signals that control the enabling transistors. When the input of the inverter in FIG. 3 transitions from HIGH to LOW the scaled conditioning pull-up transistor 352 is enabled by transistor 351 because the output of the inverter is LOW at the start of this transition and the output of feedback inverter pair 361 and 364 is also LOW since there are an even number of inverter stages in the feedback delay circuit. This turns ON enabling transistor 351. During this transition the scaled conditioning pull-down transistor is disabled by transistor 354 because the output of the inverter is LOW at the start of this transition and the output of feedback inverter pair 365 and 368 is also LOW. This turns OFF enabling transistor 354. This conditioning action on the transistors that control the inverter output speeds up the inverter output transition and reduces the crow-bar current since only the smaller primary pull-down transistor is ON during this transition.

After the output of the inverter transitions to the HIGH state, the feedback delay inverters cause the inputs to the enabling transistors 351 and 354 to also transition HIGH after an appropriate delay that is sufficient to allow the output transition to complete before changing state. This turns off scaled pull-up transistor 351 and turns on scaled pull-down transistor 354 thereby conditioning the inverter to respond faster and more efficiently on the succeeding HIGH-to-LOW transition on the inverter output.

Advantages of the Conditioning Logic Inverter—FIG. 3

The combined action of the conditioning circuits in circuit block 320 is to speed up both the positive and negative transitions on the inverter output and increase the slew rate for both transitions. The crow-bar currents are also reduced for both transitions. Typically pull-up transistor 352 would be much larger than transistor 341. Transistor 341 only needs to be large enough to maintain a high enough level on the output of the inverter when the series combination of transistors 351 and 352 is OFF. Transistor 341 must maintain a HIGH level against all sources of leakage and noise on this node. Similarly pull-down transistor 353 would be much larger than transistor 342. Transistor 342 only needs to be large enough to maintain a low enough level on the output of the inverter when the series combination of transistors 353 and 354 is OFF. Transistor 342 must maintain a LOW level against all sources of leakage and noise on this node. Enabling transistors also must be large—comparable in size to transistors 352 and 353.

Figure 4:
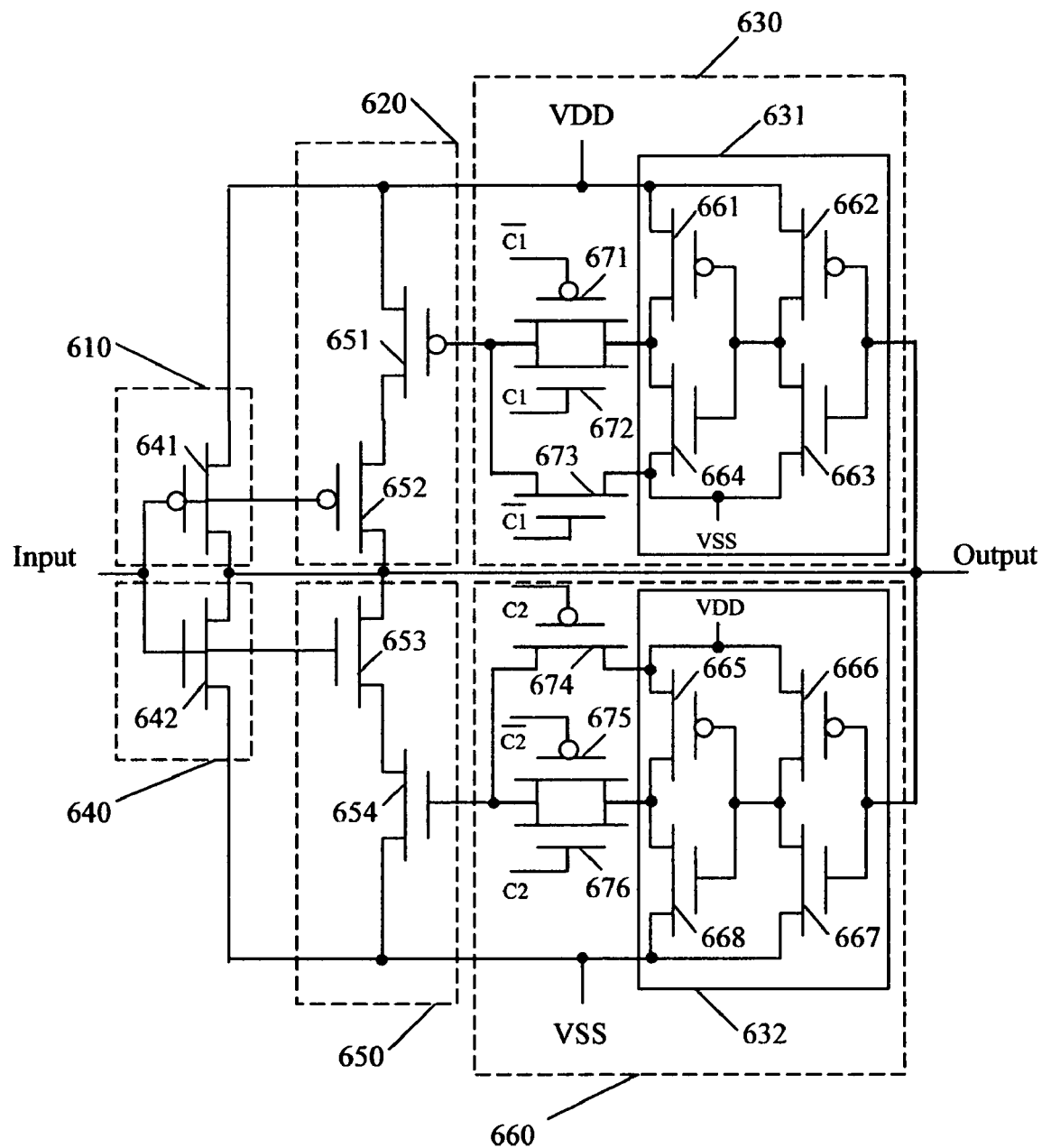
FIG. 4 shows an example of a conditioning logic inverter using more generalized circuits for generating the binary feedback signals that enable the inverter to control output transitions for de-skewing and duty cycle control.

Conditioning Logic Inverter with De-Skew Capability—FIG. 4

FIG. 4 shows an inverter with conditioning logic that utilizes a more generalized feedback circuit as shown in FIG. 2B. This feedback circuit includes two logic control signals in addition to the delay inverters that delay the output of the inverter. Control signal C1 determines whether the enabling transistor 651 in the pull-up circuitry of circuit block 620 is permanently connected to VSS (when C1 is LOW) or connected to the delayed output of the inverter (when C1 is HIGH). If C1 is LOW then C1 complement will be HIGH. C1 complement is connected to the gate of NMOS transistor 673 which connects the feedback input to the pull-up conditioning circuitry of circuit block 620 permanently to VSS (when C1 is LOW). This turns on PMOS transistor 651 which enables the conditioning pull-up transistor 652 at all times independent of the state of the delayed feedback signal. Alternatively, if C1 is HIGH, it turns on NMOS transistor 672 and C1 complement turns on PMOS transistor 671. These two transistors connect the input of the conditioning logic circuit block 620 to the delayed output of the inverter.

The delayed feedback signal is the output from the series inverters consisting of first inverter comprised of transistors 662 and 663 and a second inverter comprised of transistors 661 and 664. Thus, when C1 is HIGH the conditioning PMOS transistor 652 will be turned off before the input transitions from LOW to HIGH. This allows the output of the inverter to transition faster from HIGH to LOW in response to the LOW-to-HIGH transition on the input. On the other hand when C1 is LOW, the conditioning PMOS transistor 652 is not disabled during the HIGH-to-LOW transition on the output. This will result in a slower HIGH-to-LOW transition on the output when primary PMOS transistor 641 and conditioning PMOS transistor 652 are always both ON during the start of the HIGH-to-LOW transition on the output. This can be useful for conditionally speeding up a falling edge transition through the inverter.

Control signal C2 determines whether the enabling transistor 654 in the pull-down circuitry of circuit block 650 is permanently connected to VDD (when C2 is LOW) or connected to the delayed output of the inverter. If C2 is LOW then C2 complement will be HIGH. C2 is connected to the gate of PMOS transistor 674, which connects the feedback input to the pull-down conditioning circuitry of circuit block 650 permanently to VDD when C2 is LOW. This turns on NMOS transistor 654 which enables the conditioning pull-down transistor 653 at all times independent of the state of the delayed feedback signal. Alternatively, if C2 is HIGH it turns on NMOS transistor 676 and C2 complement turns on PMOS transistor 675. These two transistors connect the input of the conditioning logic circuit block 650 to the delayed output of the inverter. The delayed feedback signal is the output from the series inverters consisting of first inverter comprised of transistors 666 and 667 and a second inverter comprised of transistors 665 and 668. Thus, when C2 is HIGH, the conditioning NMOS transistor 653 will be turned OFF before the input transitions from HIGH to LOW. This allows the output of the inverter to transition faster from LOW to HIGH in response to the HIGH-to-LOW transition on the input. On the other hand when C2 is LOW, the conditioning NMOS transistor 653 is not disabled during the LOW-to-HIGH transition on the output. This will result in a slower LOW-to-HIGH transition on the output when primary NMOS transistor 642 and conditioning NMOS transistor 653 are always both on during the start of the LOW-to-HIGH transition on the output. This can be useful for conditionally speeding up a rising edge transition through the inverter.

Operation of the Conditioning Logic Inverter with De-Skew—FIGS. 4 and 2B

By controlling the timing of the rising and/or falling edge of the inverter, it is possible to control the timing of signals selectively through the inverter. For example, this could be used to control the duty cycle of a clock signal. If C1 is HIGH (and C1 complement is LOW), then the conditioning PMOS transistor 652 will be disabled before the input transitions from LOW to HIGH. This will cause the negative transition on the output of the inverter to occur earlier and the slew rate to increase. This would decrease the width of the positive clock pulse and increase the width of the negative clock pulse. Alternatively, if C2 is HIGH (and C2 complement is LOW), then the conditioning NMOS transistor 653 will be disabled before the input transitions from HIGH to LOW. This will cause the positive transition on the output of the inverter to occur earlier and the slew rate to increase. This would decrease the width of the negative clock pulse and increase the width of the positive clock pulse.

In summary, control signals can be added to the feedback circuitry that enable or disable the effects of the conditioning logic circuitry for the conditioning logic equivalent of any conventional logic circuit of prior art. Also this can be implemented for any subcircuit of the conditioning logic circuit provided the conditioning subcircuit is controlled by a separate enabling transistor. Since the conditioning circuitry is typically sized for driving the output loads at the required slew rates, the default state for the conditioning circuitry must be to enable it continuously. If the conditioning circuitry for both pull-up and pull-down transistors is enabled continuously, then it will drive the output like a conventional logic circuit with lower performance. If, for example, the pull-up conditioning circuitry were enabled continuously during the negative transitions on the output, then the negative transitions would be slower. The negative transitions would be comparable to the conventional case of prior art. If the pull-down conditioning circuitry were enabled continuously during the positive transitions on the output, then the positive transitions would be slower. The positive transitions would be comparable to the conventional case of prior art. The performance boost results from the action of disabling the pull-up conditioning circuitry when it would otherwise slow down a negative output transition or disabling the pull-down circuitry when it would otherwise slow down a positive output transition and dissipating more power as well. Providing controls to enable or disable the normal operation of the conditioning circuitry adds the following functional capabilities:

Enabling or disabling the conditioning for faster positive or negative transitions Active clock de-skewing Adjusting clock duty cycles Tuning of timings on critical paths Controlling asymmetric positive and negative transitions Advantages of the Conditioning Logic Inverter with De-Skew Adding a control signal to the circuitry that generates the feedback signals to the conditioning logic makes it possible to adjust timings on critical paths thereby increasing timing margins by controlling race conditions, clock skews, duty cycles, etc.

Figure 5:
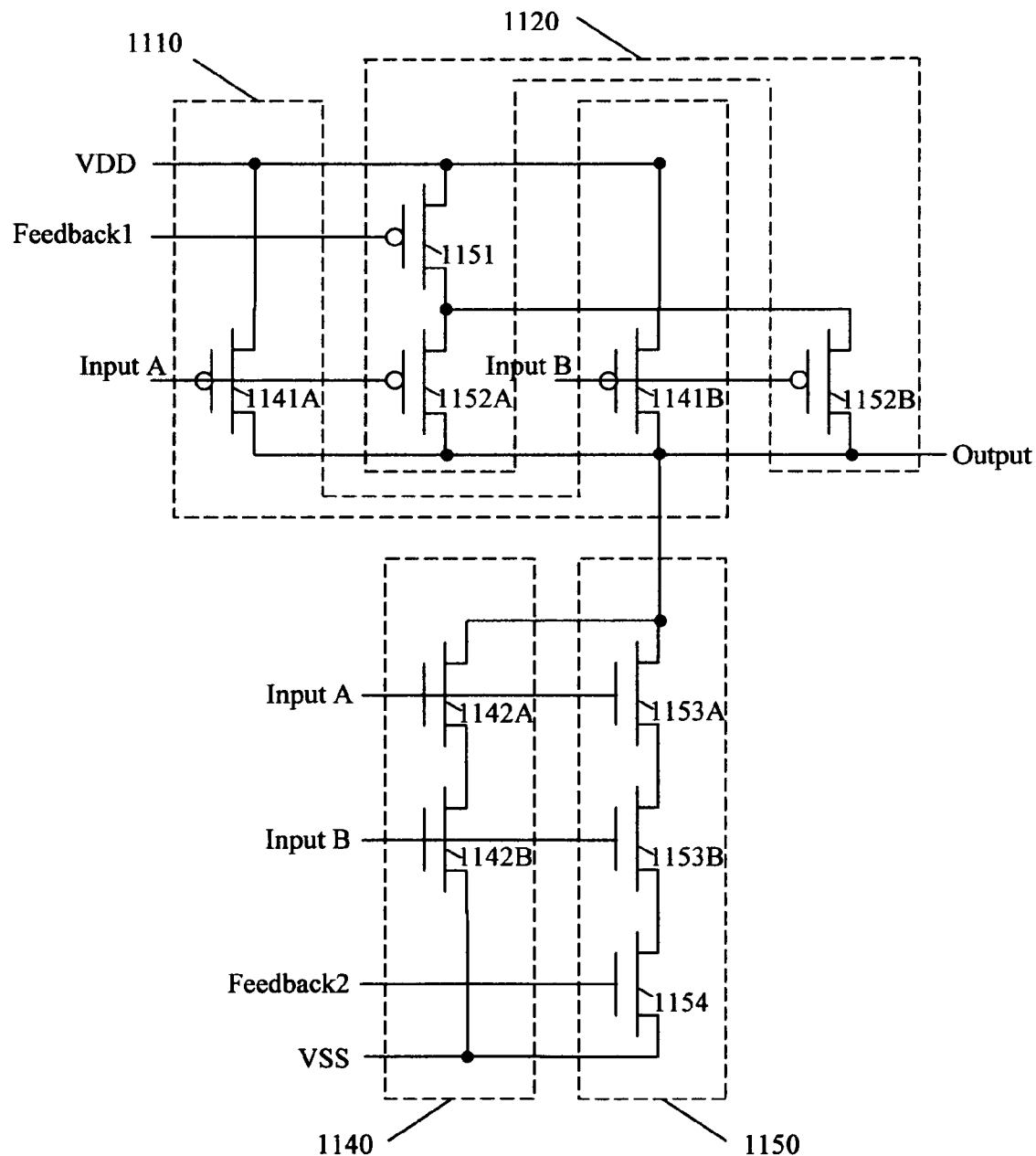
FIG. 5 shows an example of a conditioning logic NAND gate using the general form of FIG. 1 with the binary feedback circuits not shown.

Conditioning Logic NAND Gate—FIG. 5

FIG. 5 shows an implementation of a conditioning logic circuit for the case of a two-input NAND gate. Circuit block 1110 contains the parallel PMOS input transistors that provide the conventional pull-up path for the NAND gate. This circuit block consists of PMOS transistor 1141 connected between VDD and the output with Input A on its gate and PMOS transistor 1141B connected between VDD and the output with Input B on its gate. Circuit block 1140 contains the series NMOS input transistors that provide the conventional pull-down path for the NAND gate. This circuit block consists of NMOS transistor 1142A connected between the output and the drain of the series transistor 1142B with its gate connected to Input A and NMOS transistor 1142B connected between the source of transistor 1142A and VSS with its gate connected to Input B.

Circuit block 1120 contains the conditioning transistors for the NAND gate pull up. PMOS transistor 1151 is the enabling transistor with the Feedback1 signal on its gate that is connected between VDD and the sources of the two parallel conditioning pull-up transistors. Conditioning PMOS transistor 1152A is connected between the enabling pull-up transistor 1151 and the output with Input A on its gate. Conditioning PMOS transistor 1152B is connected between the enabling pull-up transistor 1151 and the output with Input B on its gate. Circuit block 1150 contains the conditioning transistors for the NAND gate pull down. NMOS transistor 1154 is the enabling pull-down transistor with the Feedback2 signal on its gate that is connected between the source of transistor 1153B and VSS. Conditioning NMOS transistor 1153A is connected between the output and the drain of series NMOS transistor 1153B with Input A on its gate. Conditioning NMOS transistor 1153B is connected between the source of NMOS transistor 1153A and the enabling transistor 1154 with Input B on its gate.

For many applications the delay of the feedback signal can be the same for pull up and pull down. In this case Feedback1 and Feedback 2 can be the same signal. If the feedback signal is simply a delayed signal from the output, the conditioning circuitry acts to speed up the transitions on the output of the NAND gate and helps to reduce the crowbar current that flows during the brief transition time when PMOS pull-up transistors and NMOS pull-down transistors are on at the same time. This improves the performance of the NAND gate.

Operation of Conditioning Logic NAND Gate—FIGS. 5 and 2A

Feedback 1 and Feedback 2 signals can be generated by the simple output delay circuit of FIG. 2A. In this case whenever the output of the NAND gate is LOW, the Feedback1 signal will turn on the pull-up enable transistor 1151 and the Feedback 2 signal will turn off the pull-down enable transistor 1154. This conditions the NAND circuit to make a fast efficient transition to the HIGH state in response to either Input A or Input B going LOW. When the output of the NAND gate achieves the HIGH state, the feedback delay circuits will turn off enabling transistor 1151 and will turn on enabling transistor 1154. This conditions the NAND circuit to make a fast efficient transition to the LOW state in response to both Input A and Input B going HIGH.

Advantages of the Conditioning Logic NAND Gate

The conditioning logic NAND gate achieves faster more efficient positive and negative transitions compared to the conventional NAND gate of prior art. Addition of control signals to feedback circuits in the form of FIG. 2B would enable control over the speed of positive and negative output transitions similar to the case of the inverter circuit.

Figure 6A:
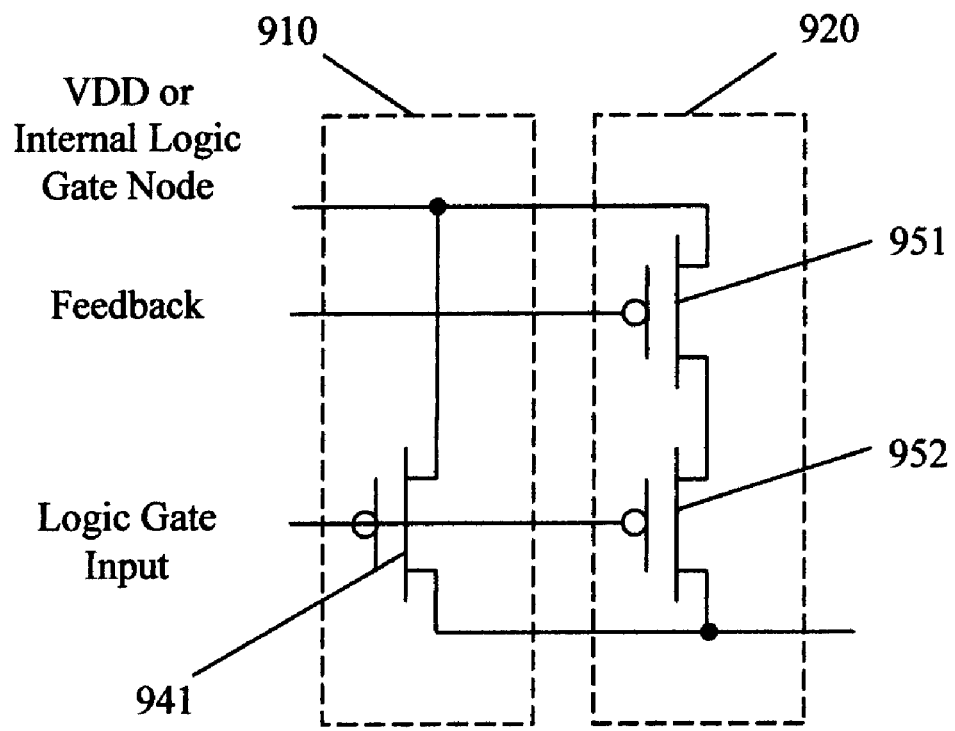
FIG. 6A shows an example using p-channel MOS transistors of a generic pull-up replacement circuit element that can be substituted for any pull-up switching element in a logic circuit in order to convert it into a conditioning logic circuit.
Figure 6B:
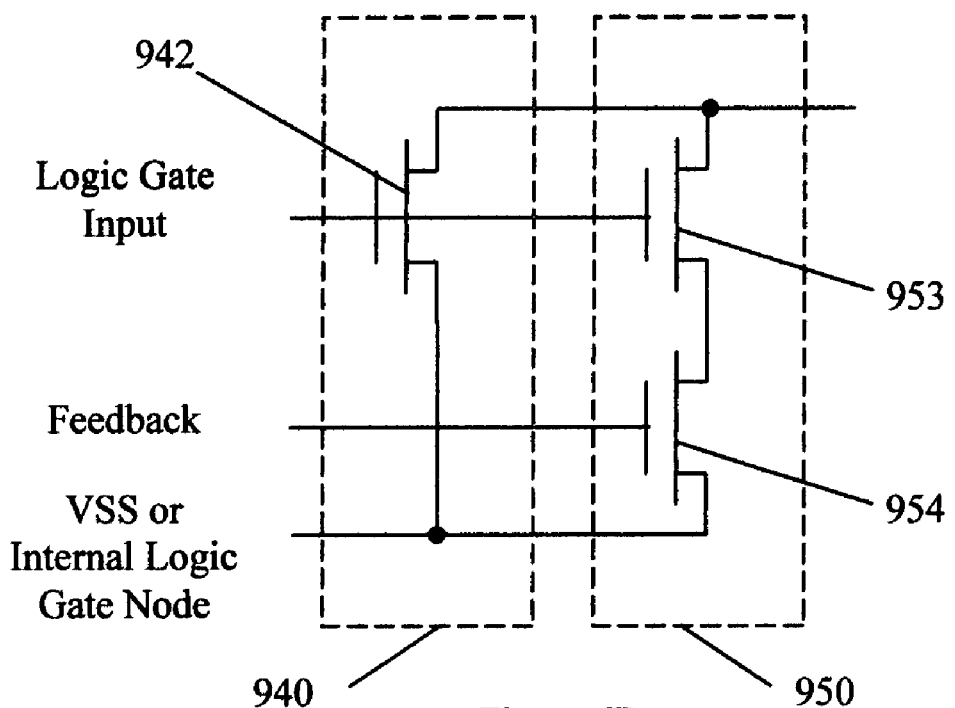
FIG. 6B shows an example using n-channel MOS transistors of a generic pull-down replacement circuit element that can be substituted for any pull-down switching element in a logic circuit in order to convert it into a conditioning logic circuit.
Figure 7:
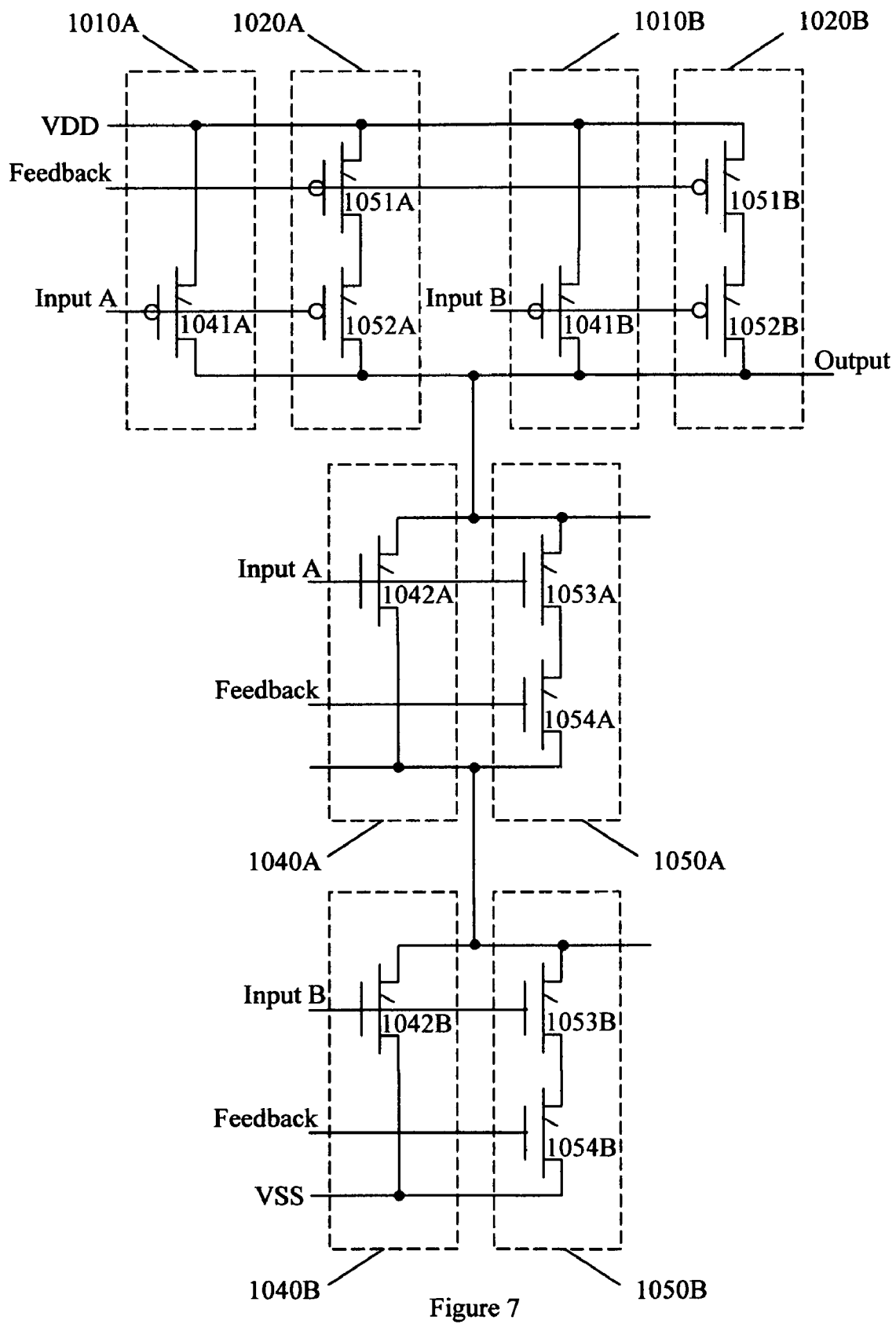
FIG. 7 shows and example of a conditioning logic NAND gate using the replacement elements of FIG. 6A and FIG. 6B resulting in a different circuit configuration.

An Alternative Implementation of Conditioning Logic—FIGS. 6A and 6B

FIGS. 6A and 6B show an alternative technique for adding conditioning logic to any logic circuit. Each pull-up transistor in the logic function can be replaced by the circuitry represented schematically in FIG. 6A. Circuit block 910 contains the original pull-up transistor to perform the logic function. In this case it is the PMOS transistor 941. Circuit block 920 contains the conditioning logic that controls the electrical characteristics of the pull-up circuitry. In this case it consists of the enabling PMOS transistor 951 which is controlled by the feedback input and the PMOS transistor 952 which operates in parallel with the original or primary pull-up transistor 941. Note that for many useful applications the original or primary pull-up transistor 941 is much smaller than the conditioning pull-up transistor 952 and the enabling transistor 951.

Each pull-down transistor in the logic function can be replaced by the circuitry represented schematically in FIG. 6B. Circuit block 940 contains the original pull-down transistor to perform the logic function. In this case it is the NMOS transistor 942. Circuit block 950 contains the conditioning logic that controls the electrical characteristics of the pull-down circuitry. In this case it consists of the enabling NMOS transistor 954 which is controlled by the feedback input and the NMOS transistor 953 which operates in parallel with the original or primary pull-down transistor 942. Note that for many useful applications the original or primary pull-down transistor 942 is much smaller than the conditioning pull-up transistor 953 and the enabling transistor 954. The drains of transistors 941 and 951 can be connected to VDD or another internal node of the logic function as required for the logic function implementation. Similarly the sources of transistors 942 and 954 can be connected to VSS or another internal node of the logic function as required for the logic function implementation.

Operation of an Alternative Implementation of Conditioning Logic—FIGS. 7, 6A, 6B, 2A, and 2B FIG. 7 illustrates the application of this general technique for adding conditioning logic to the case of a two-input NAND gate. The first logic input, A, is connected to the primary PMOS transistor 1041A of circuit block 1010A and to the conditioning PMOS transistor 1052A of circuit block 1020A. PMOS transistor 1052 is enabled by PMOS transistor 1051A, which is controlled by the feedback signal. The second logic input, B, is connected to the primary PMOS transistor 1041B of circuit block 1010B and to the conditioning PMOS transistor 1052B of circuit block 1020B. PMOS transistor 1052B is enabled by PMOS transistor 1051B, which is controlled by the feedback signal. The feedback signal could be a delayed signal from the output of the NAND gate. The four circuit blocks, 1010A, 1020A, 1010B, and 1020B are connected in parallel between VDD and the output of the NAND gate.

The first logic input, A, also is connected to the primary NMOS transistor 1042A of circuit block 1040A and to the conditioning NMOS transistor 1053A of circuit block 1050A. NMOS transistor 1053 is enabled by NMOS transistor 1054A, which is controlled by the feedback signal on its gate. The second logic input, B, is connected to the primary NMOS transistor 1042B of circuit block 1040B and to the conditioning NMOS transistor 1053B of circuit block 1050B. NMOS transistor 1053B is enabled by NMOS transistor 1054B, which is controlled by the feedback signal on its gate. The feedback signal could be a delayed signal from the output of the NAND gate. Circuit blocks 1040A and 1050A are connected in series with circuit blocks 1040B and 1050B between the output of the NAND gate and VSS.

If the feedback inputs to circuit blocks 1020A, 1020B, 1050A, and 1050B are connected to the output of an even number of inverter delay stages from the output of the inverter, the positive and negative transitions on the output of the inverter will occur earlier and the slew rate will be greater. This is due to the fact that the feedback turns off the parallel pull-up conditioning transistors during the a negative transition on the outputs and turns off the parallel pull-down conditioning transistors during a positive transition on the output.

Figure 8:
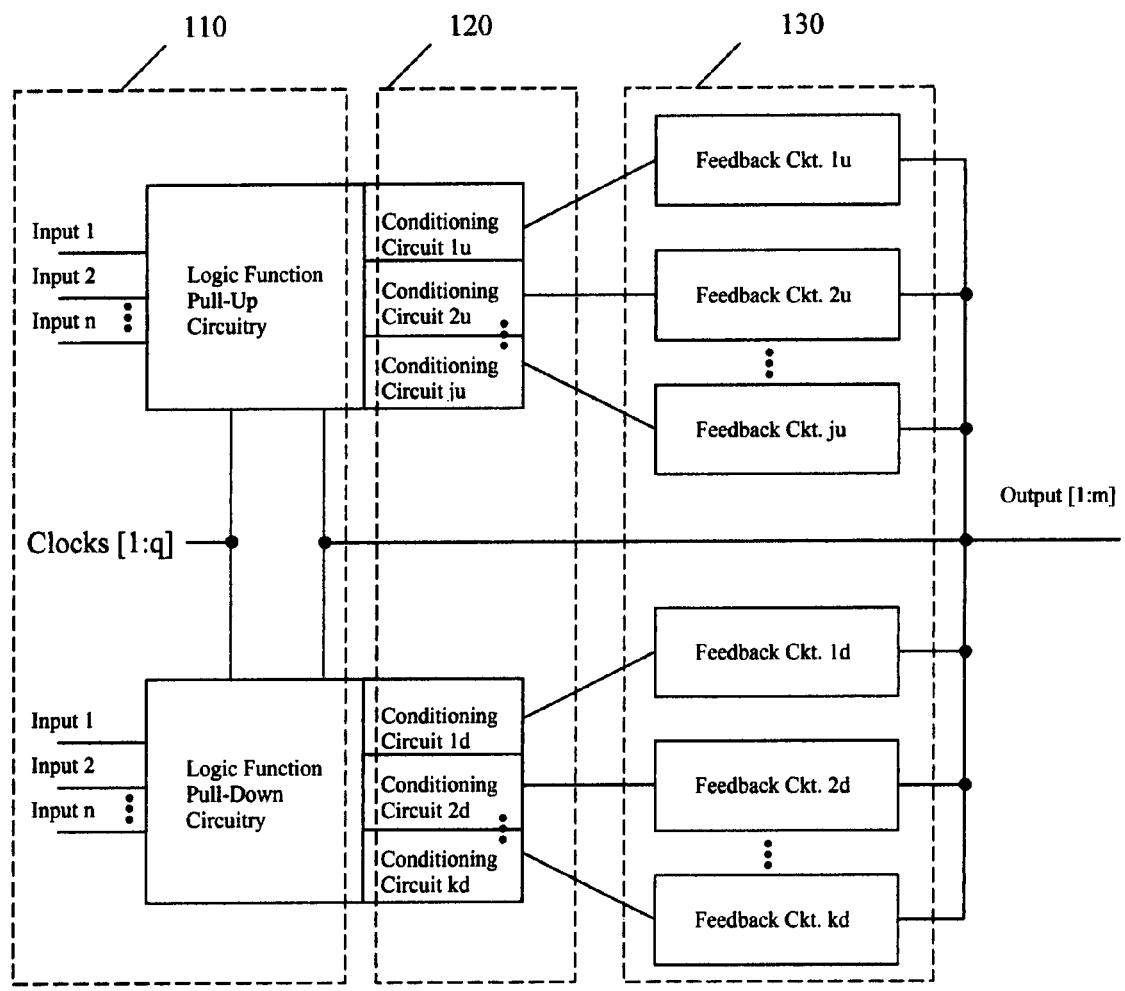
FIG. 8 shows a more general case of a conditioning logic circuit with a plurality of logic inputs, a plurality of clock inputs, a plurality of outputs, and a plurality of feedback circuits.

Advantages of an Alternative Implementation of Conditioning Logic—FIGS. 6A, 6B, and 8

Using more than one enabling transistor for the pull-up circuitry allows more control over the electrical characteristics of the conditioning logic circuit. Transition timings can be adjusted independently for different inputs for example. FIGS. 6A and 6B represent the extreme case of a conditioning transistor and an enabling transistor for each transistor in the primary pull-up logic circuit block and for each transistor in the primary pull-down logic circuit block. It is also possible to use separate conditioning transistors and enabling transistors for any subset of transistors in the primary pull-up logic circuit block or for any subset of transistors in the primary pull-down logic circuit block. It is also possible to selectively add conditioning logic transistors and enabling transistors to individual transistors or to subsets of transistors in the primary logic circuit blocks. In this case some transitions of the logic circuit would not be adjustable and would not have the benefits of conditioning logic. Use of multiple enabling transistors also permits better control of the charging currents and the required transistor sizes. The disadvantage is more transistors.

FIG. 8 illustrates this possibility showing how the conventional logic circuit of prior art can have multiple logic inputs, multiple clock inputs, and multiple outputs. The conditioning logic version is comprised of the primary pull-up logic circuit block and the primary pull-down logic circuit block contained in circuit block 110 together with scaled conditioning pull-up and pull-down subcircuit blocks in circuit block 120 that are controlled by a plurality of feedback circuit blocks contained in circuit block 130. This enables flexibility in controlling the electrical characteristics of the conditioning logic circuit.

In FIG. 8 conventional circuitry for the logic circuit of prior art is indicted by the circuitry contained in circuit block 110 but sized smaller than required for driving the load. Added conditioning circuitry, the contribution of this invention, is included in circuit block 120 and the feedback inputs needed for control of the conditioning circuitry are included in circuit block 130. The conditioning circuitry can consist of an arbitrary number, j, of circuits that affect the response of the conventional pull-up circuitry of circuit block 110 to different feedback inputs. These pull-up conditioning circuits are represented by conditioning circuits $1u$, $2u$, through ju, respectively. These conditioning circuits are controlled by feedback circuits $1u$, $2u$ through ju, respectively. Similarly the conditioning circuitry can consist of an arbitrary number, k, of circuits that affect the response of the conventional pull-down circuitry of circuit block 110 to different feedback inputs. These circuits are represented by conditioning circuits $1d$, $2d$, through kd, respectively. These conditioning circuits are controlled by feedback circuits $1d$, $2d$, through kd, respectively.

ADVANTAGES

Conditioning logic achieves faster transitions and lower active power dissipation for logic circuits and in addition makes it possible to achieve better performance with reduced leakage currents. The primary logic transistors (PMOS and NMOS) can be high-threshold transistors with little or no impact on performance because these transistors are only sized to be large enough to serve as keeper transistors. These transistors are fully turned ON when active to maintain the output state against leakage and noise so higher thresholds have little effect. If needed these transistors can be sized a little larger to make up for the reduced drive current resulting from a higher threshold voltage. Also, these primary transistors do not affect significantly the transitions on the output so the threshold voltage of these transistors can be higher.

Similarly the enabling PMOS and NMOS transistors of the pull-up and pull-down conditioning circuitry respectively, can also be high-threshold transistors with some minimal impact on performance. This is due to the fact that the PMOS enabling transistors is fully turned on well before a positive transition on the output. As a result, the threshold of this transistor does not impact the performance significantly. The PMOS enabling transistor is also fully turned off before the negative transition on the output. Similarly the NMOS enabling transistor is fully turned on well before a negative transition on the output. As a result, the threshold of this transistor does not impact the performance significantly. The NMOS enabling transistor is fully turned off before the positive transition on the output.

The only transistors that need to be low-threshold devices for high performance are the other transistors in the conditioning logic in the pull-up and pull-down paths. Leakage through these transistors can be minimized by controlling the timing of the feedback signals to the enabling transistors. The leakage current through these transistors can be minimized by delaying the turn-on of the enabling transistors until just before the transition to the opposite state is to occur on the output. It may be possible to use high threshold voltages for all of the conditioning logic transistors and still maintain adequate performance due to the faster transition speeds attainable with conditioning logic.

Transistors in the feedback path can also be high-threshold devices with no impact on performance. As a result conditioning logic can easily be optimized for low leakage and high performance.

CONCLUSION, RAMIFICATIONS, AND SCOPE

Conditioning logic is defined by conditioning logic circuitry added to a generic logic circuit that does not alter the state of the output of the generic logic circuit in response to changes in the inputs but rather changes the electrical characteristics of the logic function or logic gate in response to one or more binary feedback signals. In other words the outputs of the logic function or logic gate exhibit the same response to the inputs with or without the conditioning logic circuitry, but the conditioning logic circuitry does affect the details of the electrical characteristics of how the logic circuit responds to the inputs. Changes in the characteristics of the gate can include modification of any meaningful electrical parameters of the gate. This includes the output delay for each input. It also includes the rise and/or fall time of each output. Other characteristics of the gate can also be controlled by the conditioning circuitry such as leakage current and power dissipation. The effect of the conditioning circuitry on the electrical characteristics of the logic gate is controlled by feedback inputs to the conditioning circuitry. Again, the feedback inputs do not control the state of the output of the gate, but instead control the electrical characteristics of the circuit. The feedback signals are binary in the sense that each feedback signal either enables or disables its respective conditioning logic circuitry during the critical transition periods. These feedback signals are either ON or OFF. They are not analog signals.

There is, of course, a cost associated with conditioning logic. One cost is slightly increased area. For many implementations the largest contribution to the additional area is the incremental area associated with the enabling transistors. In addition there is a slight overhead for isolating the smaller primary transistors of the basic logic function and a small area for the feedback circuits, which usually can be implemented with minimum-size transistors. Often larger driver transistors are comprised of multiple transistor fingers tied in parallel anyway so splitting off one finger for the primary transistor would be straight forward from a layout perspective. The other cost associated with conditioning logic is the additional effort associated with insuring proper operation and timing of the feedback signals. This can be very straight forward for many implementations. The timing margins can be very relaxed in many cases. On the other hand, more effort would be involved for full optimization of more complex implementations.

Achieving timing closure on advanced System-On-a-Chip (SOC) designs and Application-Specific-Integrated-Circuit (ASIC) designs is often very challenging. This task involves multiple iterations to determine how to alter the logical implementation and physical layout of the design in order to achieve the required timing performance for the complete design. Often this is the most time-consuming task in the entire design process. Conditioning logic provides the ability to substitute higher performance logic functions on the critical path(s), which can reduce significantly the amount of time required to complete designs. Typically it is only necessary to replace a small fraction of the conventional logic gates in a typical design with their conditioning logic equivalents in order to achieve the necessary timing improvements on the critical path(s). The fact that conditioning logic slightly increases the area of any given logic function is relatively insignificant because only a small fraction of the logic gates needs to be replaced in order to achieve timing requirements on the critical path(s). Alternatively, the performance of the Integrated Circuit (IC) can be improved with the same amount of effort on the timing closure task as required for generic logic.

Conditioning logic equivalents can be designed for all gates in a standard cell library or they can be designed for some subset of frequently used gates. Typically the high-drive-current gates would benefit the most when converted to conditioning logic equivalents. Different strategies can be employed in the use of conditioning logic gates depending on the application requirements. Appropriate conditioning logic gates can be used only on the critical path to improve performance as needed. Alternatively, conditioning logic gates could be used throughout an IC design in order to achieve a given performance level with lower leakage and lower active currents. It may be possible to use high-threshold transistors in the conditioning logic functions and still maintain the performance of standard- or low-threshold transistors. This can enable higher performance with lower power. The appropriate strategy to use for the mixture of conventional and conditioning logic gates in a particular design depends on the application requirements and the priorities for performance, area, and power.

Conditioning logic is especially well suited to advanced IC design because it is completely compatible with generic logic equivalents. A general method is provided for converting any logic gate to a conditioning logic equivalent of higher performance and lower current. Examples are provided for a simple inverter and for a simple two-input NAND gate. The design of conditioning logic functions or gates can be easily generalized for any logic function. Schematics for CMOS circuits are used for these examples but the techniques for designing conditioning logic equivalents can be applied to any logic family. Examples provided here are for improving timing and reducing active currents and leakage currents, but conditioning logic can be used to modify any electrical characteristics as desired.

The invention claimed is:

1. A complementary logic circuit with improved electrical characteristics comprising:
    a. a primary pull up logic circuit block that consists of all electrical switching elements necessary to pull the output of said logic circuit high in response to a set of logic inputs that determine when said primary pull up logic circuit block is activated to pull said output of said logic circuit high, and
    b. a scaled pull up logic circuit block that replicates said primary pull up logic circuit block except for a scaling factor, s1, that multiplies the pull up strength of said scaled pull up logic circuit block and is connected in parallel with said primary pull up circuit block and is connected in series with a first block switch controlled by a first binary feedback signal that determines whether said scaled pull up circuit block is activated, and
    c. a primary pull down logic circuit block that consists of all electrical switching elements necessary to pull said output of said logic circuit low in response to said set of logic inputs that determine when said primary pull down logic circuit block is activated to pull said output of said logic circuit low, and
    d. a scaled pull down logic circuit block that replicates said primary pull down logic circuit block except for a scaling factor, s2, that multiplies the pull down strength of said scaled pull down logic circuit block and is connected in parallel with said primary pull down circuit block and is connected in series with a second block switch controlled by a second binary feedback signal that determines whether said scaled pull down circuit block is activated, and
    e. a first binary feedback signal that has two states, one state turns said scaled pull up logic circuit block on and the other state turns said scaled pull up logic circuit block off, and f. a second binary feedback signal that has two states, one state turns said scaled pull down logic circuit block on and the other state turns said scaled pull down logic circuit block off, and whereby said scaled pull up and said scaled pull down circuit blocks can be turned on and off in proper synchronism with said inputs and output of said logic circuit so as to achieve improved electrical characteristics including any desired combination of improved speed, reduced power dissipation, and improved timing robustness of said logic circuit by turning scaled pull up circuit blocks on during low to high transitions and off during high to low transitions on outputs and by turning scaled pull down circuit blocks on during high to low transitions and off during low to high transitions.

2. The logic circuit of claim 1 wherein:
   a. said first binary feedback signal is generated by a first circuit that produces a fixed delay of said output of said logic circuit, and
   b. said second binary feedback signal is generated by a second circuit that produces a fixed delay of said output of said logic circuit, and
whereby the delay interval of said first binary feedback signal is long enough to allow completion of the transition of said output from low to high before said scaled pull up circuit block is turned off and the delay interval of said second binary feedback signal is long enough to allow completion of the transition of said output from high to low before said scaled pull down circuit block is turned off.

3. The logic circuit of claim 2 wherein said first binary feedback signal and said second binary feedback signal are generated by a common delay circuit, and whereby the delay interval of said common delay circuit is long enough to allow completion of the transition of said output from low to high before said scaled pull up circuit block is turned off and long enough to allow completion of the transition of said output from high to low before said scaled pull down circuit block is turned off.

4. The logic circuit of claim 3 that comprises an inverter wherein:
   a. said primary pull up logic circuit block consists of a single pull up switch such as a p channel MOS transistor controlled by a single input signal, and
   b. said scaled pull up circuit block consists of a single pull up switch such as a larger p channel MOS transistor controlled by said single input signal connected in parallel with said primary pull up logic circuit block and in series with said first block switch such as a p channel MOS transistor which is controlled by said first binary feedback signal which is generated by a common delay circuit which delays the transition on said output of said logic circuit, and
   c. said primary pull down logic circuit block consists of a single pull down switch such as an n channel MOS transistor controlled by said single input signal, and
   d. said scaled pull down circuit block consists of a single pull down switch such as a larger n channel MOS transistor controlled by said single input signal connected in parallel with said primary pull down logic circuit block and in series with said second block switch such as a n channel MOS transistor which is controlled by said second binary feedback signal which is generated by a common delay circuit which delays the transition on said output of said logic circuit, and
   e. said first binary feedback signal and said second binary feedback signal are generated by a common circuit that delays transitions on said output of said logic circuit, and
   whereby said logic circuit implements an inverter with improved delay characteristics and reduced power dissipation compared with a standard inverter comprised of just said primary pull up circuit block and said primary pull down circuit block.

5. The logic circuit of claim 3 that comprises a NAND gate in which:
   a. said primary pull up logic circuit block consists of a first parallel pull up switch and a second parallel pull up switch such as a p channel MOS transistor with said first parallel pull up switch controlled by logic input signal A and said second parallel pull up switch controlled by logic input signal B, and
   b. said scaled pull up circuit block consists of a first parallel pull up switch and a second parallel pull up switch such as a larger p channel MOS transistor with said first parallel pull up switch controlled by logic input signal A and said second parallel pull up switch controlled by logic input signal B and said first and second parallel switches in series with said first block switch such as a p channel MOS transistor which is controlled by said first binary feedback signal which is generated by a common delay circuit which delays the transition on said output of said logic circuit, and
   c. said primary pull down logic circuit block consists of a first series pull down switch connected to a second series pull down switch such as a n channel MOS transistor with said first series pull down switch controlled by said logic input signal A and said second series pull down switch controlled by said logic input signal B, and
   d. said scaled pull down circuit block consists of a first series pull down switch and a second series pull down switch such as a larger n channel MOS transistor with said first series pull down switch controlled by said logic input signal A and said second series pull down switch controlled by said logic input signal B and said first and second series switches in series with said second block switch such as a n channel MOS transistor which is controlled by said second binary feedback signal which is generated by a common delay circuit which delays the transition on said output of said logic NAND circuit, and
   e. said first binary feedback signal and said second binary feedback signal are generated by a common circuit that delays transitions on said output of said logic circuit, and
   whereby said logic circuit implements a NAND gate with improved delay characteristics and reduced power dissipation compared with a standard NAND gate comprised of just said primary pull up circuit block and said primary pull down circuit block.

6. The logic circuit of claim 1 wherein:
   a said first binary feedback signal is generated by a first circuit that produces either a fixed delay of said output of said logic circuit or continuously enables said scaled pull up circuit block, and
   b. said second binary feedback signal is generated by a second circuit that produces a fixed delay of said output of said logic circuit or continuously enables said scaled pull down circuit block, and
whereby the delay interval of said first binary feedback signal is long enough to allow completion of the transition of said output from low to high before said scaled pull up circuit block is turned off and the delay interval of said second binary feedback signal is long enough to allow completion of the transition of said output from high to low before said scaled pull down circuit block is turned off and if said first binary feedback signal is continuously enabled the high to low transition of said output of said logic circuit is slowed down to that of a conventional logic circuit of prior art and if said second binary feedback signal is continuously enabled the low to high transition of said output of said logic circuit is slowed down to that of a conventional logic circuit of prior art thereby enabling adjustment of timings, duty cycles, and pulse widths on said output of said logic circuit.

7. The logic circuit of claim 6 that comprises an inverter wherein:
   a. said primary pull up logic circuit block consists of a single pull up switch such as a p channel MOS transistor controlled by a single input signal, and
   b. said scaled pull up circuit block consists of a single pull up switch such as a larger p channel MOS transistor controlled by said single input signal connected in parallel with said primary pull up logic circuit block and in series with said first block switch such as a p channel MOS transistor which is controlled by said first binary feedback signal which is generated by a common delay circuit which delays the transitions on said output of said logic circuit, and
   c. said primary pull down logic circuit block consists of a single pull down switch such as an n channel MOS transistor controlled by said single input signal, and
   d. said scaled pull down circuit block consists of a single pull down switch such as a larger n channel MOS transistor controlled by said single input signal connected in parallel with said primary pull down logic circuit block and in series with said second block switch such as a n channel MOS transistor which is controlled by said second binary feedback signal which is generated by a common delay circuit which delays the transition on said output of said logic circuit, and
   e. said first binary feedback signal is generated by a first circuit that produces either a fixed delay of said output of said logic circuit or continuously enables said scaled pull up circuit block, and
   f. said second binary feedback signal is generated by a second circuit that produces a fixed delay of said output of said logic circuit or continuously enables said scaled pull down circuit block, and whereby the delay interval of said first binary feedback signal is long enough to allow completion of the transition of said output from low to high before said scaled pull up circuit block is turned off and the delay interval of said second binary feedback signal is long enough to allow completion of the transition of said output from high to low before said scaled pull down circuit block is turned off and if said first binary feedback signal is continuously enabled the high to low transition of said output of said logic circuit is slowed down to that of a conventional logic circuit of prior art and if said second binary feedback signal is continuously enabled the low to high transition of said output of said logic circuit is slowed down to that of a conventional logic circuit of prior art thereby enabling adjustment of timings, duty cycles, and pulse widths on said output of said logic circuit comprising an inverter with independently adjustable output rise and fall transitions.

8. A complementary logic circuit with improved electrical characteristics comprising:
   a. a plurality of replacement pull up logic circuit elements each comprised of a primary pull up switching element in parallel with a scaled pull up circuit element that is in series with a pull up switch controlled by a binary feedback signal that determines whether said scaled pull up circuit element is activated, and
   b. a plurality of replacement pull down logic circuit elements each comprised of a primary pull down switching element in parallel with a scaled pull down circuit element that is in series with a pull down switch controlled by a binary feedback signal that determines whether said scaled pull down circuit element is activated, and
   c. a complementary logic circuit wherein said replacement pull up logic circuit elements are substituted for conventional pull up logic circuit elements and wherein said replacement pull down logic circuit elements are substituted for conventional pull down logic circuit elements, and
   d. a plurality of pull up binary feedback signals each of which has two states, one state turns said scaled pull up logic circuit element on and the other state turns said scaled pull up logic circuit element off, and each of which controls one of the replacement pull up logic circuit elements, and
   e. a plurality of pull down binary feedback signals each of which has two states, one state turns said scaled pull down logic circuit element on and the other state turns said scaled pull down logic circuit elements off and each of which controls one of the replacement pull-down logic circuit elements, and whereby said scaled pull up logic circuit elements and said scaled pull down logic circuit elements can be turned on and off in proper synchronism with said inputs and outputs of said logic circuit so as to achieve improved electrical characteristics including any desired combination of improved speed, reduced power dissipation, and improved timing robustness of said logic circuit by turning scaled pull up logic circuit elements off during high to low transitions on outputs and by turning scaled pull down logic circuit elements off during low to high transitions.

9. The logic circuit of claim 8 wherein one or more of the plurality of binary feedback signals provides timing control to optimize other electrical characteristics of the logic circuit such as output voltage and current levels.

10. The logic circuit of claim 8 wherein two or more of the pull down binary feedback signals and pull up binary feedback signals are generated by a common circuit.

* * * * *